(12) United States Patent
Harada et al.

(10) Patent No.: US 11,149,231 B2
(45) Date of Patent: Oct. 19, 2021

(54) CLEANING LIQUID, CLEANING METHOD, AND METHOD FOR PRODUCING SEMICONDUCTOR WAFER

(71) Applicant: Mitsubishi Chemical Corporation, Chiyoda-ku (JP)

(72) Inventors: Ken Harada, Tokyo (JP); Yutaro Takeshita, Tokyo (JP); Toshiaki Shibata, Tokyo (JP); Kan Takeshita, Tokyo (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 16/835,402

(22) Filed: Mar. 31, 2020

(65) Prior Publication Data

US 2020/0231900 A1    Jul. 23, 2020

Related U.S. Application Data

(63) Continuation of application No. PCT/JP2018/037429, filed on Oct. 5, 2018.

(30) Foreign Application Priority Data

Oct. 10, 2017  (JP) .............................. JP2017-196812
Oct. 23, 2017  (JP) .............................. JP2017-204135

(51) Int. Cl.
*C11D 7/32* (2006.01)
*C11D 1/34* (2006.01)
(Continued)

(52) U.S. Cl.
CPC ................ *C11D 1/345* (2013.01); *C11D 1/06* (2013.01); *C11D 3/0047* (2013.01);
(Continued)

(58) Field of Classification Search
CPC .................................................. C11D 11/0047
(Continued)

(56) References Cited

U.S. PATENT DOCUMENTS

2006/0166847 A1    7/2006  Walker et al.
2007/0167343 A1    7/2007  Suzuki et al.
(Continued)

FOREIGN PATENT DOCUMENTS

JP    2008-528762 A    7/2008
JP    2010-515246 A    5/2010
(Continued)

OTHER PUBLICATIONS

International Search Report dated Nov. 6, 2018 in PCT/JP2018/037429 filed on Oct. 5, 2018 (with English Translation), 9 pages.

*Primary Examiner* — Gregory E Webb
(74) *Attorney, Agent, or Firm* — Oblon, McClelland, Maier & Neustadt, L.L.P.

(57) ABSTRACT

A cleaning liquid containing at least one surfactant (A) selected from the group consisting of a polyoxyalkylene alkyl ether phosphoric acid, a polyoxyalkylene alkyl ether acetic acid and a polyoxyalkylene alkyl ether sulfonic acid and a chelating agent (C), which has a pH of 8 or more, and a cleaning liquid containing an oxidizing agent (B) and a chelating agent (C), which has a pH of 8 or more.

20 Claims, 1 Drawing Sheet

(51) Int. Cl.
*C11D 1/06* (2006.01)
*C11D 3/00* (2006.01)
*C11D 3/20* (2006.01)
*C11D 3/30* (2006.01)
*C11D 3/33* (2006.01)
*C11D 3/39* (2006.01)
*C11D 11/00* (2006.01)

(52) U.S. Cl.
CPC .............. *C11D 3/2082* (2013.01); *C11D 3/30* (2013.01); *C11D 3/33* (2013.01); *C11D 3/3942* (2013.01); *C11D 11/0047* (2013.01)

(58) Field of Classification Search
USPC ........................................................ 510/175
See application file for complete search history.

(56) References Cited

U.S. PATENT DOCUMENTS

| | | | |
|---|---|---|---|
| 2009/0286708 A1* | 11/2009 | Murakami | C11D 11/0047 510/175 |
| 2010/0051066 A1 | 3/2010 | Kuwabara et al. | |
| 2010/0056409 A1 | 3/2010 | Walker et al. | |
| 2010/0163788 A1 | 7/2010 | Visintin et al. | |
| 2010/0167535 A1* | 7/2010 | Nishiwaki | H01L 21/76867 438/669 |
| 2013/0174867 A1 | 7/2013 | Harada et al. | |
| 2013/0296214 A1 | 11/2013 | Barnes et al. | |
| 2014/0371124 A1* | 12/2014 | Harada | C11D 3/2079 510/175 |
| 2015/0018261 A1 | 1/2015 | Li et al. | |
| 2015/0111804 A1 | 4/2015 | Dory et al. | |
| 2015/0307818 A1 | 10/2015 | Barnes et al. | |
| 2016/0010035 A1 | 1/2016 | Liu et al. | |
| 2017/0335248 A1 | 11/2017 | Oie et al. | |
| 2019/0136161 A1* | 5/2019 | Kamimura | C11D 7/268 |
| 2019/0177670 A1* | 6/2019 | Kamimura | H01L 21/31111 |
| 2019/0194580 A1* | 6/2019 | Kamimura | C11D 7/261 |
| 2020/0002652 A1* | 1/2020 | Kusano | C11D 7/5013 |

FOREIGN PATENT DOCUMENTS

| | | |
|---|---|---|
| JP | 2012-074678 A | 4/2012 |
| JP | 2013-533631 A | 8/2013 |
| JP | 2015-512959 A | 4/2015 |
| JP | 2016-021573 A | 2/2016 |
| JP | 2016-536392 A | 11/2016 |
| WO | WO 2006/025373 A1 | 3/2006 |
| WO | WO 2007/072727 A1 | 6/2007 |
| WO | WO 2016/076034 A1 | 5/2016 |

* cited by examiner

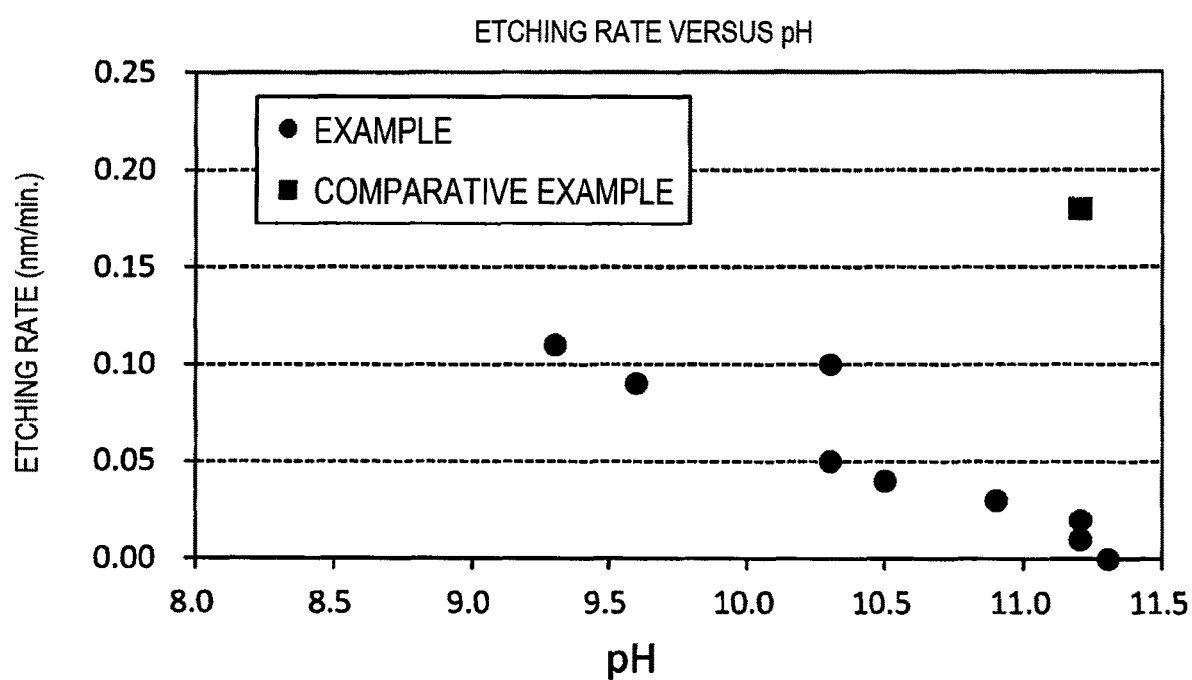

CLEANING LIQUID, CLEANING METHOD, AND METHOD FOR PRODUCING SEMICONDUCTOR WAFER

TECHNICAL FIELD

The present invention relates to a cleaning liquid, a cleaning method, and a method for producing a semiconductor wafer.

BACKGROUND ART

A semiconductor wafer is produced by deposition of a metal film working as a wiring and an interlayer insulating film on a silicon substrate, subsequently conducting a surface planarization by means of a chemical mechanical polishing (hereinafter referred to as "CMP") step using an abrasive composed of an aqueous slurry containing fine abrasive particles, and then stacking new layers on the planarized surface. In microfabrication of a semiconductor wafer, each layer is required to have planarity with high precision, and importance of the planarization treatment by means of CMP is very high.

The semiconductor wafer includes interconnect layers that have copper, a copper alloy and a barrier metal, and a contact plug layer having a contact plug for electrically connecting a transistor and the interconnect layer. The interconnect layer or the contact plug layer is formed on the same substrate by repeated processes, and similarly planarized by CMP.

Large quantities of abrasive particles such as colloidal silica derived from an abrasive used in the CMP step, an anticorrosive-derived organic residue, or the like are present on the surface of the semiconductor wafer after the CMP step, and therefore, in order to remove them, the semiconductor wafer after the CMP step is subjected to a cleaning step.

Semiconductor integrated circuits are required to improve day-to-day performance, and have been actively developed. One way of improving the performance includes miniaturization of transistors, contact plugs, and wiring structures. In order to improve the performance, a new metal is applied to each layer.

In order to prevent copper ions from diffusing into an insulating film layer in the interconnect layer, Ta/TaN (tantalum/tantalum nitride) is used as a barrier metal on the outside of a copper wiring and the Ta/TaN layer has to be made thinner with the miniaturization of the copper wiring. However, if the Ta/TaN layer is made thin, there is a limit to the barrier property of copper ion diffusion, so that there is a limit to thinning this layer. To compensate for their barrier properties, cobalt, ruthenium and alloys thereof have been considered as candidate materials. When cobalt or ruthenium is used in combination with Ta/TaN, the barrier metal layer can be further thinned, and further miniaturization of the wiring structure can be realized.

In addition, when copper, tungsten, or a tungsten alloy, which has been conventionally used, is used as a material of a wiring or a contact plug in a contact plug layer, there is a problem of a signal delay due to an increase in resistance value associated with miniaturization. Therefore, a wiring or contact plug made of cobalt or cobalt alloy having a short mean free path of electrons has begun to be introduced. At the same time, various cleaning liquids for cleaning surfaces where the cobalt or cobalt alloy is exposed have begun to be proposed.

As a cleaning liquid used for cleaning a semiconductor wafer, for example, cleaning liquids described in Patent Literatures 1 to 7 have been proposed.

BACKGROUND ART LITERATURE

Patent Literature

Patent Literature 1: JP-T-2008-528762
Patent Literature 2: JP-T-2010-515246
Patent Literature 3: JP-T-2013-533631
Patent Literature 4: JP-T-2015-512959
Patent Literature 5: JP-A-2016-21573
Patent Literature 6: JP-A-2012-74678
Patent Literature 7: WO 2007/72727

SUMMARY OF INVENTION

Technical Problem

Incidentally, in a state in which copper and cobalt or copper and ruthenium are in contact with each other, since ionization tendencies of them are different, the base metal is oxidized and dissolved by the local cell reaction and corrosion is caused. This corrosion is called Galvanic corrosion. Cobalt is oxidized and dissolved in the composition of copper and cobalt, and copper is oxidized and dissolved in the composition of copper and ruthenium. Conventionally, although Ta/TaN, which was used as a barrier metal, was also a base metal compared to copper, Glavanic corrosion did not occur and was not a problem since Ta formed a passivated oxide film on the surface. However, since the wiring becomes thinner in the advanced generation devices, there is a risk of causing severe operation failure even with fine corrosion which has not been a problem before, and galvanic corrosion significantly increases the risk of the severe operation failure.

Further, trace metal components such as derivatives eluted from the metal is present as residues on a surface of a semiconductor wafer after a CMP step or after an etching step, and these residues can be dissolved and removed with a chelating agent or the like. However, the chelating agent may cause corrosion or oxidative degradation of the metal on the surface of the semiconductor wafer. The residual components and a mechanism of corrosion and oxidative deterioration are different depending on a type of metal exposed on the surface of the semiconductor wafer.

Although Patent Literatures 1 to 5 disclose that cobalt is an object to be cleaned, a specified surfactant to be described later is not disclosed and a use of the specified surfactant to be described later for the purpose of suppressing corrosion of cobalt or cobalt alloy is not disclosed.

In addition, although Patent Literatures 1 to 5 disclose that cobalt is an object to be cleaned, an oxidizing agent is not disclosed, and use of the oxidizing agent for the purpose of suppressing corrosion of cobalt or a cobalt alloy is not disclosed.

Furthermore, although Patent Literature 6 discloses that cobalt is an object to be cleaned and discloses a specified surfactant to be described later, adjusting a pH to 8 or more is not disclosed, and adjusting the pH to 8 or more for the purpose of suppressing corrosion of cobalt or a cobalt alloy is not disclosed.

Further, although Patent Literature 7 discloses that cobalt is an object to be cleaned and discloses an oxidizing agent, adjusting a pH to 8 or more is not disclosed, and adjusting the pH to 8 or more for the purpose of suppressing corrosion of cobalt or a cobalt alloy is not disclosed.

The present invention has been made in view of such problems, and an object of the present invention is to provide a cleaning liquid having a cleaning effect of post-CMP cleaning or post-etch cleaning with suppressing corrosion of cobalt or a compound containing cobalt. Another object of the present invention is to provide a method for cleaning a semiconductor wafer using a cleaning liquid having a cleaning effect of post-CMP cleaning or post-etch cleaning with suppressing corrosion of cobalt or a compound containing cobalt.

Solution to Problem

Conventionally, surfactants used for post-CMP cleaning or post-etch cleaning have been used for the purpose of controlling the zeta potential. However, as a result of intensive studies, the present inventors have found that a specified surfactant to be described later can sufficiently exert a cleaning effect of post-CMP cleaning or post-etch cleaning with suppressing corrosion of cobalt or a compound containing cobalt.

In addition, it has been considered that an oxidizing agent causes oxidation of a metal and cause corrosion of a metal. However, the present inventors conducted intensive studies, and as a result, the present inventors found that an oxide film is formed on a surface of cobalt or a compound containing cobalt by an oxidizing agent and corrosion of cobalt or a compound containing cobalt is effectively suppressed, and still further, the present inventors found that a cleaning liquid containing an oxidizing agent can sufficiently exert a cleaning effect of post-CMP cleaning or post-etch cleaning with suppressing corrosion of cobalt or a compound containing cobalt.

Namely, the gist of the present invention is as follows.

[1] A cleaning liquid containing a surfactant (A) and a chelating agent (C) and having a pH of 8 or more, wherein the surfactant (A) contains at least one selected from the group consisting of a polyoxyalkylene alkyl ether phosphoric acid, a polyoxyalkylene alkyl ether acetic acid, and a polyoxyalkylene alkyl ether sulfonic acid.

[2] The cleaning liquid according to [1], wherein the surfactant (A) contains a polyoxyalkylene alkyl ether phosphoric acid.

[3] A cleaning liquid containing an oxidizing agent (B) and a chelating agent (C) and having a pH of 8 or more.

[4] The cleaning liquid according to [3], wherein a content of the oxidizing agent (B) is from 0.00001 mass % to 0.8 mass %.

[5] The cleaning liquid according to any one of [1] to [4], wherein the chelating agent (C) contains at least one selected from the group consisting of amino acids and polycarboxylic acids.

[6] The cleaning liquid according to [5], wherein the amino acids are at least one selected from the group consisting of serine and aspartic acid.

[7] The cleaning liquid according to [5], wherein the polycarboxylic acids contain tartaric acid.

[8] The cleaning liquid according to any one of [1] to [7], further containing a pH adjusting agent (D).

[9] The cleaning liquid according to [8], wherein a mass ratio of the chelating agent (C) to the pH adjusting agent (D) is from 1:1.5 to 1:8.

[10] The cleaning liquid according to any one of [1] to [9], which is used for cleaning after chemical mechanical polishing or post-etch cleaning.

[11] The cleaning liquid according to any one of [1] to [10], which is used for cleaning a surface where cobalt or a compound containing cobalt is exposed.

[12] Use of the cleaning liquid according to any one of [1] to [10] for cleaning a semiconductor wafer in which cobalt or a compound containing cobalt is exposed.

[13] A cleaning method for cleaning a semiconductor wafer using the cleaning liquid according to any one of [1] to [11].

A method for producing a semiconductor wafer, containing cleaning a semiconductor wafer using the cleaning liquid according to any one of [1] to [11].

Effects of Invention

The cleaning liquid of the present invention has a cleaning effect of post-CMP cleaning or post-etch cleaning with suppressing corrosion of cobalt or a compound containing cobalt in a cleaning step of a semiconductor wafer after a CMP step or after an etching step. In the wafer cleaning method of the present invention, a malfunction of a semiconductor device can be suppressed since a semiconductor wafer is cleaned by using the cleaning liquid of the present invention having the cleaning effect of post-CMP cleaning or post-etch cleaning with suppressing the corrosion of cobalt or a compound containing cobalt.

BRIEF DESCRIPTION OF DRAWINGS

FIG. 1 is a FIGURE showing an etching rate for pH in Examples 2-1 to 2-9 and Comparative Example 2-1.

DESCRIPTION OF EMBODIMENTS

Although embodiments of the present invention are hereunder specifically described, it should not be construed that the present invention is limited to the following embodiments, and the present invention can be carried out by making various changes within the scope of a gist thereof. In this specification, the expression "to" is used as an expression including numerical values or physical property values before and after the expression.

(Cleaning Liquid)

A cleaning liquid according to an embodiment of the present invention includes a surfactant (A) and a chelating agent (C). The cleaning liquid according to another embodiment of the present invention includes an oxidizing agent (B) and a chelating agent (C). Hereinafter, each component will be described in detail.

(Surfactant (A))

A surfactant (A) is at least one selected from the group consisting of a polyoxyalkylene alkyl ether phosphoric acid, a polyoxyalkylene alkyl ether acetic acid, and a polyoxyalkylene alkyl ether sulfonic acid. As the surfactant (A), one of these surfactants may be used alone, or two or more thereof may be used in combination.

By using at least one selected from the group consisting of the polyoxyalkylene alkyl ether phosphoric acid, the polyoxyalkylene alkyl ether acetic acid, and the polyoxyalkylene alkyl ether sulfonic acid as a surfactant, residues on a semiconductor wafer can be decreased while corrosion of cobalt or a compound containing cobalt is suppressed.

The alkyl group in the surfactant (A) is hydrophobic and is molecularly oriented on the surface of the semiconductor wafer. Since the functional groups represented by phosphoric acid, acetic acid, and sulfonic acid can be coordinated to cobalt or a compound containing cobalt, the surfactant is coordinated to cobalt or a compound containing cobalt exposed on the surface of the semiconductor wafer, and acts as an anticorrosive, thereby suppressing corrosion on the surface of cobalt or the compound containing cobalt. On the other hand, the oxyalkylene group is hydrophilic, is not molecularly oriented on the surface of the semiconductor wafer, and has an affinity with water. Therefore, although the surfactant in the present invention exhibits an anticorrosion effect on cobalt or a compound containing cobalt, it is considered that the surfactant cannot remain on the surface of the wafer in a rinsing step after the cleaning step, and thus a sufficient cleaning effect can be exhibited.

The alkyl group in the surfactant (A) is preferably an alkyl group having 8 or more carbon atoms, which may be linear or branched, and may include a ring.

The alkyl group preferably has from 8 to 24 carbon atoms, more preferably from 8 to 20 carbon atoms, and still more preferably from 12 to 18 carbon atoms. When the number of carbon atoms of the alkyl group is 8 or more, the hydrophobicity of the surfactant is enhanced, and the surfactant is easily adsorbed on the surface of the semiconductor wafer. When the number of carbon atoms of the alkyl group is 24 or less, the surfactant can be easily removed in the rinsing step after the cleaning step.

Among the phosphate group, the acetic acid group, and the sulfonic acid group in the surfactant (A), the phosphate group and the sulfonic acid group are preferred due to the strong coordination and anticorrosion effects thereof on cobalt, and the phosphate group is more preferred due to easy production of the surfactant itself.

The oxyalkylene group in the surfactant (A) is preferably an ethylene oxide group or a propylene oxide group. Since both the ethylene oxide group and the propylene oxide group exhibit hydrophilicity, the effect on cobalt or the compound containing cobalt is small, and the effect of the surfactant on the anticorrosion performance is small. Due to high hydrophilicity, an ethylene oxide group is particularly preferred.

The number of repetitions of the oxyalkylene groups in the surfactant (A) is preferably from 1 to 30, more preferably from 1 to 20, and still more preferably from 2 to 10. When the number of repetitions is small, the hydrophobicity of the surfactant becomes stronger, an adsorption action on the surface of the semiconductor device wafer becomes stronger, and the effect of anticorrosion on cobalt or the compound containing cobalt becomes stronger. When the number of repetitions is large, the hydrophilicity of the surfactant is increased, the adsorption action on the surface of the semiconductor device wafer is weakened, and the anticorrosion effect on cobalt or the compound containing cobalt is weakened. In consideration of such a situation, the number of repetitions may be set appropriately.

Specifically, the polyoxyalkylene alkyl ether phosphoric acid, the polyoxyalkylene alkyl ether acetic acid, and the polyoxyalkylene alkyl ether sulfonic acid are specifically represented by the following formulae (1) to (3).

(1)

(2)

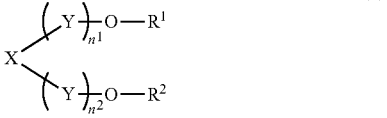
(3)

(Compound Represented by Formula (1))

In formula (1), R represents an alkyl group having 8 or more carbon atoms, which may be linear or branched, may have a double bond, and may include a ring.

In formula (1), the alkyl group of R preferably has from 8 to 24 carbon atoms, more preferably from 8 to 20 carbon atoms, and still more preferably from 12 to 18 carbon atoms. In formula (1), when the number of carbon atoms of the alkyl group of R is 8 or more, the hydrophobicity of the surfactant is increased, and the surfactant is easily adsorbed on the surface of a semiconductor substrate. In the formula (1), when the number of carbon atoms of the alkyl group of R is 24 or less, the surfactant can be easily removed in the rinsing step after the cleaning step.

In formula (1), X represents an acetate group ($-CH_2COOH$), a phosphate group, or a sulfonic acid group.

In formula (1), X is preferably a phosphate group or a sulfonic acid group due to the strong coordination effect thereof on cobalt and the strong anticorrosion effect, and the phosphate group is more preferred due to easy production of the surfactant itself.

In formula (1), Y represents an ethylene oxide group or a propylene oxide group. Since both the ethylene oxide group and the propylene oxide group exhibit hydrophilicity, the effect on cobalt or the compound containing cobalt is small, and the effect of the surfactant on the anticorrosion performance is small. The oxygen atom at the end of Y is bonded to X.

In formula (1), Y is preferably an ethylene oxide group due to the high hydrophilicity thereof.

In formula (1), n is an integer of 1 or more.

In formula (1), n is preferably from 1 to 30, more preferably from 1 to 20, and still more preferably from 2 to 10. When n is small, the hydrophobicity of the surfactant becomes stronger, the adsorption action on the surface of the semiconductor wafer becomes stronger, and the effect of anticorrosion on cobalt or the compound containing cobalt becomes stronger. When n is large, the hydrophilicity of the surfactant is increased, the adsorption action on the surface of the semiconductor wafer is weakened, and the anticorrosion effect on cobalt or the compound containing cobalt is weakened. In consideration of such a situation, n may be set appropriately.

(Compound Represented by Formula (2))

In formula (2), each of $R^1$ and $R^2$ represents an alkyl group having 8 or more carbon atoms, which may be linear or branched, may have a double bond, and may include a ring. Additionally, $R^1$ and $R^2$ may be the same or different.

In formula (2), the alkyl group of $R^1$ and $R^2$ preferably has from 8 to 24 carbon atoms, more preferably from 8 to 20 carbon atoms, and still more preferably from 12 to 18 carbon atoms. In formula (2), when the number of carbon atoms of the alkyl group of $R^1$ and $R^2$ is 8 or more, the hydrophobicity of the surfactant is increased, and the surfactant is easily adsorbed on the surface of the semiconductor substrate. In the formula (2), when the number of carbon atoms of the alkyl group of $R^1$ and $R^2$ is 24 or less, the surfactant can be easily removed in the rinsing step after the cleaning step.

In formula (2), X represents a phosphate group or a sulfonic acid group.

In formula (2), X is preferably a phosphate group due to the strong coordination effect on cobalt and the strong anticorrosion effect, and the easy production of the surfactant itself.

In formula (2), Y represents an ethylene oxide group or a propylene oxide group, and each of which may be the same or different. Since both the ethylene oxide group and the propylene oxide group exhibit hydrophilicity, the effect on cobalt or the compound containing cobalt is small, and the effect of the surfactant on the anticorrosion performance is small. The oxygen atom at the end of Y is bonded to X.

In formula (2), Y is preferably an ethylene oxide group due to the high hydrophilicity thereof.

In formula (2), each of $n^1$ and $n^2$ represents an integer of 1 or more, and may be the same or different from each other.

In formula (2), $n^1$ and $n^2$ are preferably from 1 to 30, more preferably from 1 to 20, and still more preferably from 2 to 10. When $n^1$ and $n^2$ are small, the hydrophobicity of the surfactant becomes stronger, the adsorption action on the surface of the semiconductor wafer becomes stronger, and the effect of anticorrosion on cobalt or the compound containing cobalt becomes stronger. When $n^1$ and $n^2$ are large, the hydrophilicity of the surfactant is increased, the adsorption action on the surface of the semiconductor wafer is weakened, and the anticorrosion effect on cobalt or the compound containing cobalt is weakened. In consideration of such a situation, $n^1$ and $n^2$ may be set appropriately.

In formula (3), each of $R^1$, $R^2$, and $R^3$ represents an alkyl group having 8 or more carbon atoms, may be linear or branched, may have a double bond, and may include a ring. Additionally, each of $R^1$, $R^2$, and $R^3$ which may be the same or different.

In formula (3), the alkyl group of $R^1$, $R^2$, and $R^3$ preferably has from 8 to 24 carbon atoms, more preferably from 8 to 20 carbon atoms, and still more preferably from 12 to 18 carbon atoms. In formula (3), when the number of carbon atoms of the alkyl group of $R^1$, $R^2$, and $R^3$ is 8 or more, the hydrophobicity of the surfactant is increased, and the surfactant is easily adsorbed on the surface of the semiconductor substrate. In formula (3), when the number of carbon atoms of the alkyl group of $R^1$, $R^2$, and $R^3$ is 24 or less, the surfactant can be easily removed in the rinsing step after the cleaning step.

In formula (3), X is a phosphate group.

In formula (3), X is preferably a phosphate group due to the strong coordination effect on cobalt and the strong anticorrosion effect, and the easy production of the surfactant itself.

In formula (3), Y represents an ethylene oxide group or a propylene oxide group, and each of which may be the same or different. Since both the ethylene oxide group and the propylene oxide group exhibit hydrophilicity, the effect on cobalt or the compound containing cobalt is small, and the effect of the surfactant on the anticorrosion performance is small. The oxygen atom at the end of Y is bonded to X.

In formula (3), Y is preferably an ethylene oxide group due to the high hydrophilicity thereof.

In formula (3), each of $n^1$, $n^2$, and $n^3$ represents an integer of 1 or more, and $n^1$, $n^2$, and $n^3$ may be the same or different from each other.

In formula (3), $n^1$, $n^2$ and $n^3$ are preferably from 1 to 30, more preferably from 1 to 20, and still more preferably from 2 to 10. When $n^1$, $n^2$, and $n^3$ are small, the hydrophobicity of the surfactant becomes stronger, the adsorption action on the surface of the semiconductor wafer becomes stronger, and the effect of anticorrosion on cobalt or the compound containing cobalt becomes stronger. When $n^1$, $n^2$, and $n^3$ are large, the hydrophilicity of the surfactant is increased, the adsorption action on the surface of the semiconductor wafer is weakened, and the anticorrosion effect on cobalt or the compound containing cobalt is weakened. In consideration of such a situation, $n^1$, $n^2$, and $n^3$ may be set appropriately.

(Content of Surfactant (A))

The content of the surfactant (A) in the cleaning liquid is preferably from 0.00001 mass % to 2 mass %, more preferably from 0.00005 mass % to 0.2 mass %, still more preferably from 0.0001 mass % to 0.05 mass %, and particularly preferably from 0.0005 mass % to 0.01 mass %, based on 100 mass % of the cleaning liquid. When the content of the surfactant (A) in the cleaning liquid is 0.00001 mass % or more, the anticorrosion effect on cobalt or the compound containing cobalt is excellent. When the content of the surfactant (A) in the cleaning liquid is 2 mass % or less, a foaming of the cleaning liquid can be suppressed, and the cleaning liquid after cleaning can be easily washed with water.

(Oxidizing Agent (B))

Since the cleaning liquid contains the oxidizing agent (B), an oxide film is formed on the surface of cobalt or the compound containing cobalt, and a dissolution and corrosion caused by components in the cleaning liquid are suppressed. As a result, the cleaning liquid of the present invention containing the oxidizing agent (B) has a cleaning effect as a post-CMP cleaning liquid with suppressing corrosion of cobalt or the compound containing cobalt.

The oxidizing agent (B) may be any as long as the oxidizing agent can oxidize the surface of a metal represented by cobalt or a compound containing cobalt, and examples thereof include hydrogen peroxide, ozone, nitric acid, nitrous acid, persulfuric acid, dichromic acid, permanganate, and salts thereof. These oxidizing agents (B) may be used alone or in combination of two or more thereof. Among these oxidizing agents (B), hydrogen peroxide and ozone are preferred due to low damage to dissolution or increase in surface roughness to metals other than cobalt or a compound containing cobalt, and therefore hydrogen peroxide and ozone are preferred. Additionally, hydrogen peroxide is more preferred due to the high versatility thereof in the CMP step.

The content of the oxidizing agent (B) in the cleaning liquid is preferably from 0.000001 mass % to 10 mass %, more preferably from 0.000005 mass % to 3 mass %, still more preferably from 0.00001 mass % to 0.8 mass %, and particularly preferably from 0.0005 mass % to 0.3 mass %, based on 100 mass % of the cleaning liquid. When the content of the oxidizing agent (B) in the cleaning liquid is 0.00001 mass % or more, the anticorrosion effect on cobalt or the compound containing cobalt is excellent. When the content of the oxidizing agent (B) in the cleaning liquid is 10 mass % or less, generation of decomposition gas of the oxidizing agent (B) can be suppressed, and the cleaning liquid after cleaning can be easily washed with water.

In the cleaning liquid of the present invention, in consideration of decomposition of the oxidizing agent (B) over time, a cleaning liquid excluding the oxidizing agent (B) may be prepared, and the oxidizing agent (B) may be blended so as to have the above-mentioned content immediately before use.

(Chelating Agent (C))

The cleaning liquid of the present invention includes a chelating agent (C) in addition to the surfactant (A) or the oxidizing agent (B), due to the excellent removability of metal ions and metal complexes.

The chelating agent (C) may be a compound which has an amino group, a carboxyl group, a phosphonium group, a sulfur atom, or the like, and can be coordinated with a metal ion, and amino acids and polycarboxylic acids are preferred due to excellent removability of metal ions and metal complexes and low corrosiveness of cobalt or the compound containing cobalt.

Examples of the chelating agent (C) having an amino group include alkanolamines such as ethanolamine and propanolamine and derivatives thereof; monoamines such as alkylamines and derivatives thereof; diamines such as ethylenediamine, diaminopropane and diaminobutane and derivatives thereof; polyfunctional amines and derivatives thereof; amino acids such as glycine, serine, aspartic acid, histidine, and derivatives thereof; amino polycarboxylic acids such as ethylenediaminetetraacetic acid and propylenediamine tetraacetic acid, and derivatives thereof. The chelating agent (C) having an amino group may be used alone, or two or more thereof may be used in combination. Among the chelating agents (C) having an amino group, serine, aspartic acid, histidine, glycine, and ethylenediaminetetraacetic acid are preferred, and serine and aspartic acid are more preferred, due to the excellent removability of the metal ions and the metal complex and low corrosiveness of cobalt or the compound containing cobalt.

Examples of the chelating agent (C) having a carboxyl group include monocarboxylic acids such as acetic acid and derivatives thereof; dicarboxylic acids such as oxalic acid, tartaric acid and malic acid, and derivatives thereof; tricarboxylic acids such as citric acid and their derivatives; amino acids such as glycine, serine, aspartic acid, histidine, and derivatives thereof;

amino polycarboxylic acids such as ethylenediaminetetraacetic acid and propylenediamine tetraacetic acid, and derivatives thereof. The chelating agent (C) having a carboxyl group may be used alone, or two or more thereof may be used in combination. Among the chelating agents (C) having these carboxyl groups, tartaric acid, citric acid, malic acid, oxalic acid, a derivative of tartaric acid, a derivative of citric acid, a derivative of malic acid, and a derivative of oxalic acid are preferred, and tartaric acid and citric acid are more preferred, due to the excellent removability of the metal ions and the metal complex and low corrosiveness of cobalt or the compound containing cobalt.

Examples of the chelating agent (C) having a phosphonium group include triphenylphosphine, 1,2-bis(diphenylphosphino) ethane, and derivatives thereof. One of these chelating agents (C) having a phosphonium group may be used alone, or two or more thereof may be used in combination. Among these chelating agents (C) having a phosphonium group, triphenylphosphine and derivatives thereof are preferred due to the excellent removability of metal ions and metal complexes and the low corrosiveness of cobalt or the compound containing cobalt.

Examples of the chelating agent (C) having a sulfur atom include thiols such as cysteine, methanethiol, ethanethiol, thiophenol, and glutathione, and derivatives thereof; methionine, and thioethers such as dimethylsulfide and derivatives thereof.

(Content of Chelating Agent (C))

The content of the chelating agent (C) in the cleaning liquid is preferably from 0.001 mass % to 5 mass %, more preferably from 0.002 mass % to 3 mass %, still more preferably from 0.005 mass % to 0.5 mass %, and particularly preferably from 0.01 mass % to 0.1 mass %, based on 100 mass % of the cleaning liquid. When the content of the chelating agent (C) in the cleaning liquid is 0.001 mass % or more, a removability of the metal ions or the metal complexs is excellent. When the content of the chelating agent (C) in the cleaning liquid is 5 mass % or less, the cleaning liquid has excellent low corrosiveness of cobalt or the compound containing cobalt.

(pH Adjusting Agent (D))

Since the cleaning liquid of the present invention can control the corrosion of cobalt or the compound containing cobalt by adjusting the pH, it is preferable to further contain a pH adjusting agent (D).

Examples of the pH adjusting agent (D) include acids, alkalis, and salts thereof. Among the pH adjusting agents (D), acids, alkalis, and salts thereof are preferred, and alkali and salts of alkali are more preferred, due to excellent control of corrosion of cobalt or the compound containing cobalt.

Examples of the acids include an inorganic acid and an organic acid. These acids may be used alone or in combination of two or more thereof. Among these acids, inorganic acids and organic acids are preferred, and organic acids are more preferred, due to excellent low corrosiveness of cobalt or the compound containing cobalt.

Examples of the inorganic acids include sulfuric acid, hydrochloric acid, nitric acid, and phosphoric acid. These inorganic acids may be used alone or in combination of two or more thereof. Among these inorganic acids, sulfuric acid and phosphoric acid are preferred, and phosphoric acid is more preferred since damage to the semiconductor device wafer is small.

Examples of the organic acids include an organic compound having an amino group, a carboxyl group, a sulfonic acid group, or a phosphonium group. These organic acids may be used alone or in combination of two or more thereof. Among these organic acids, since corrosion of cobalt or the compound containing cobalt can be controlled, an organic compound having an amino group or a carboxyl group is preferred, and an organic compound having a carboxyl group is more preferred.

Examples of the alkali include an inorganic alkali and an organic alkali. These alkalis may be used alone, or two or more thereof may be used in combination. Among these alkalis, inorganic alkalis and organic alkalis are preferred due to easy production of the alkali itself, and potassium hydroxide, tetramethylammonium hydroxide, tetraethylammonium hydroxide, tetrabutylammonium hydroxide are more preferred, and potassium hydroxide, tetraethylammonium hydroxide, and tetrabutylammonium hydroxide are still more preferred.

(Content of pH Adjusting Agent (D))

A content of the pH adjusting agent (D) in the cleaning liquid is preferably from 0.001 mass % to 50 mass %, more preferably from 0.005 mass % to 20 mass %, still more preferably from 0.02 mass % to 2 mass %, and particularly preferably from 0.05 mass % to 0.5 mass %, based on 100 mass % of the cleaning liquid. When the content of the pH adjusting agent (D) in the cleaning liquid is 0.001 mass % or more, the cleaning liquid has excellent low corrosiveness of cobalt or the compound containing cobalt. When the content of the pH adjusting agent (D) in the cleaning liquid is 50 mass % or less, the residual of the pH adjusting agent itself can be suppressed.

A pH of the cleaning liquid is 8 or more, preferably from 8 to 14, more preferably from 9 to 13, and still more preferably from 10 to 12. When the pH of the cleaning liquid is alkaline, the hydroxyl group is abundant, so that a colloidal silica derived from a polishing agent used in the CMP step and a surface of a semiconductor wafer are both negatively charged, and an electric repulsive force acts to facilitate the removal of the colloidal silica.

A mass ratio of the surfactant (A) to the chelating agent (C) is preferably from 1:1.5 to 1:50, and more preferably from 1:2 to 1:40 since both the low corrosiveness of cobalt or the compound containing cobalt and the removability of an anticorrosive can be achieved.

A mass ratio of the surfactant (A) to the pH adjusting agent (D) is preferably from 1:5 to 1:200, more preferably from 1:10 to 1:100, since the surfactant (A) is completely dissolved in the solution and has a sufficient amount by which the function is shown.

A mass ratio of the chelating agent (C) to the oxidizing agent (B) is preferably from 1:0.01 to 1:50, and more preferably from 1:0.03 to 1:20, since both the low corrosiveness of cobalt or the compound containing cobalt and the removability of an anticorrosive can be achieved.

A mass ratio of the pH adjusting agent (D) to the oxidizing agent (B) is preferably from 1:0.05 to 1:200, and more preferably from 1:0.1 to 1:100, since both the low corrosiveness of cobalt or the compound containing cobalt and the removability of an anticorrosive can be achieved.

A mass ratio of the chelating agent (C) to the pH adjusting agent (D) is preferably from 1:1.2 to 1:10, and more preferably from 1:1.5 to 1:8, since a pH which can ensure low corrosiveness of cobalt or the compound containing cobalt and the removability of the abrasive particles with removing metal ions and metal complexes.

(Other Components)

Since the cleaning liquid of the present invention has excellent low corrosiveness of cobalt or a compound containing cobalt, it is preferable to further contain an anticorrosive.

Examples of the anticorrosives include compounds having a heterocyclic ring such as imidazole, triazole, benzotriazole, and derivatives thereof; and water-soluble polymers which can be coordinated to metals such as polyacrylic acid, polyethylene glycol, and polypropylene glycol, and derivatives thereof. These anticorrosives may be used alone or in combination of two or more thereof. Among these anticorrosives, imidazole, polyethylene glycol, derivatives of imidazole, and derivatives of polyethylene glycol are preferred due to the excellent rinsing properties after cleaning.

Since the cleaning liquid containing the surfactant (A) of the present invention has excellent low corrosiveness of cobalt or a compound containing cobalt, it is preferable to further contain a deoxidizer or a reducing agent.

Examples of the deoxidizer and the reducing agent include L-ascorbic acid, D-ascorbic acid, gallic acid, methyl gallate, hydrazine, hydroxylamine, and derivatives thereof. These deoxidizer and reducing agents may be used alone or in combination of two or more thereof.

Among these deoxidizer and reducing agents, L-ascorbic acid, D-ascorbic acid, derivatives of L-ascorbic acid, and derivatives of D-ascorbic acid are preferred due to the excellent handleability.

In addition, an oxidizing agent such as hydrogen peroxide, ozone, or oxygen may be contained as long as the performance is not impaired.

The cleaning liquid containing the oxidizing agent (B) of the present invention preferably does not contain a deoxidizer or a reducing agent since an oxidation-reduction reaction occurs in the cleaning liquid.

Examples of the deoxidizer and the reducing agent include L-ascorbic acid, D-ascorbic acid, gallic acid, methyl gallate, hydrazine, hydroxylamine, and derivatives thereof.

The cleaning liquid of the present invention may contain components other than the above components as long as the performance is not impaired.

Examples of the other components include etching accelerators that can be expected to remove dissolved gases such as hydrogen, argon, nitrogen, carbon dioxide, and ammonia, or remove polymers firmly attached after dry etching such as fluorine, ammonium fluoride, and buffered hydrofluoric acid.

(Solvent)

The solvent of the cleaning liquid of the present invention is preferably water. The solvent may contain components other than water such as ethanol.

(Method for Producing Cleaning Liquid)

The method for producing the cleaning liquid of the present invention is not particularly limited, and a known method may be used. For example, the cleaning liquid can be produced by mixing components of the cleaning liquid. Usually, the cleaning liquid is produced by mixing components other than water with water as a solvent.

The mixing order is not particularly limited as long as there are no special circumstances such as the occurrence of a reaction or a precipitate, and some of the components of the cleaning liquid may be mixed in advance, and then the remaining components may be mixed. Alternatively, all components may be mixed at once. In addition, in order to suppress the cost of transportation and storage, a high-concentration cleaning liquid may be prepared and diluted with a solvent to have an appropriate content immediately before use.

(Method for Cleaning Semiconductor Wafer)

The method for cleaning a semiconductor wafer of the present invention is a method for cleaning a surface of a semiconductor wafer where cobalt or a compound containing cobalt is exposed, using the cleaning liquid of the present invention.

The method for cleaning the semiconductor wafer of the present invention is suitably used for the surface of the semiconductor wafer where cobalt or the compound containing cobalt is exposed after a CMP step or after an etching step. Cobalt or the compound containing cobalt may contain impurities as long as a performance of a semiconductor device is not impaired.

The CMP step refers to a process of mechanically processing and planarizing the surface of a semiconductor wafer. In general, in the CMP process, using a dedicated device, a back side of the semiconductor wafer is attached to a head, and the surface of the semiconductor wafer is pressed against a polishing pad, and an abrasive containing abrasive particles is dropped onto the polishing pad to polish the surface of the semiconductor wafer.

The etching step refers to a process of removing a target thin film in a pattern using a resist formed in a lithography process as a mask and forming a desired shape on the semiconductor wafer. Examples of the shape formed in the etching step include a wiring pattern, a via hole for electrically connecting wirings, and a trench (groove) for separating elements. In general, the etching step is performed by a method called reactive ion etching using a reactive gas such as fluorocarbon.

The post-etch cleaning is a step of removing residues generated in the etching step from the semiconductor wafer. In the post-etch cleaning step, an object to be removed, such as a resist residue, a gas-derived fluoropolymer, an insulating film, and a wiring metal composite, is detached from the semiconductor wafer using a cleaning liquid.

(Object to be Cleaned)

Examples of the semiconductor wafer to be cleaned include various semiconductor wafers such as semiconductors, glass, metals, ceramics, resins, magnetic materials, and superconductors.

A more preferable object to be cleaned is a surface of a semiconductor wafer having a contact plug of cobalt or a compound containing cobalt which plays a role of electrically connecting a transistor and an interconnect layer, and a surface of a semiconductor wafer having an interconnect layer of cobalt or a compound including cobalt.

Further, the method for cleaning a semiconductor wafer of the present invention has a high cleaning effect even on a low-dielectric-constant insulating material having a high hydrophobicity, and thus is suitably used for a semiconductor wafer having a low-dielectric-constant insulating material.

Examples of the low-dielectric-constant material include organic polymer materials such as polyimide, BCB (benzocyclobutene), Flare (trade name, Honeywell), SiLK (trade name, Dow Chemical Company); inorganic polymer materials such as FSG (fluorinated silicate glass); SiOC-based materials such as BLACK DIAMOND (trade name, Applied Materials), Aurora (trade name, ASM Japan), and the like.

(CMP Step)

In the CMP step, polishing is performed by rubbing the semiconductor wafer against the polishing pad using an abrasive.

Examples of the abrasive include abrasive particles such as colloidal silica ($SiO_2$), fumed silica ($SiO_2$), alumina ($Al_2O_3$), and ceria ($CeO_2$). These abrasive particles are the main cause of particulate contamination of the semiconductor wafer. However, the cleaning liquid of the present invention has a function of removing fine particles adhering to the semiconductor wafer, dispersing the particles in the cleaning liquid, and preventing re-adhesion, and thus exhibits a high effect on the removal of particulate contamination.

In addition to the abrasive particles, additives such as an oxidizing agent and a dispersing agent may be included in the abrasive. In particular, an anticorrosive is often contained in CMP in a semiconductor wafer having cobalt or a compound containing cobalt since cobalt or the compound containing cobalt is easily corroded.

As the anticorrosive for the abrasive in CMP, an azole anticorrosive having a high anticorrosive effect is preferably used. More specifically, examples of the anticorrosive containing a heterocycle in which the hetero atom is only a nitrogen atom include a diazole, a triazole, and a tetrazole; examples of the anticorrosive containing a heterocycle including a nitrogen atom and an oxygen atom include an oxazole, an isoxazole, and an oxadiazole; and examples of the anticorrosive containing a heterocycle including a nitrogen atom and a sulfur atom include a thiazole, an isothiazole, and a thiadiazole.

The cleaning liquid of the present invention is excellent in that contamination derived from these anticorrosives can be removed very effectively when it is applied to a semiconductor wafer after being polished with an abrasive containing such an anticorrosive. Namely, when such an anticorrosive is present in the abrasive, a corrosion of the surface of cobalt or the compound containing cobalt is suppressed, while many insoluble precipitates are generated by reacting with cobalt ions eluted at the time of polishing. The cleaning liquid of the present invention can efficiently dissolve and remove such insoluble precipitates and can improve the throughput.

(Cleaning Conditions)

The method for cleaning the semiconductor wafer of the present invention is preferably a method of bringing the cleaning liquid of the present invention into direct contact with the semiconductor wafer. The concentration of each component in the cleaning liquid of the present invention may be selected according to a type of the semiconductor wafer to be cleaned.

As a method of bringing the cleaning liquid into direct contact with the semiconductor wafer, for example, a dipping method in which a cleaning tank is filled with the cleaning liquid of the present invention to immerse the semiconductor wafer; a spin method for rotating the semiconductor wafer at high speed with flowing the cleaning liquid of the present invention onto the semiconductor wafer from a nozzle; and a spray method for spraying and cleaning the cleaning liquid of the present invention on the semiconductor wafer. Examples of an apparatus for performing such cleaning include a batch cleaning apparatus for simultaneously cleaning a plurality of semiconductor wafers accommodated in a cassette, a single-wafer cleaning apparatus for mounting a single semiconductor wafer on a holder and performing cleaning, and the like.

Among the methods of directly bringing these cleaning liquids into contact with the semiconductor wafer, the spin method and the spray method are preferred since more efficient decontamination can be performed in a short time. In this case, an apparatus for performing the cleaning is preferably a sheet-type cleaning apparatus since the cleaning time can be shortened and the use of the cleaning liquid of the present invention can be reduced.

The method for cleaning a semiconductor wafer of the present invention is preferably performed by physical force since the removability of fine particles attached to the semiconductor wafer is further improved and the cleaning time can be shortened, the scrub cleaning using a cleaning brush and the ultrasonic cleaning with a frequency of 0.5 megahertz or more is more preferred, and scrub cleaning using a resin brush is still more preferred since the scrub cleaning using the resin brush is more suitable for cleaning after the CMP step.

Although the material of the resin brush is not particularly limited, PVA (polyvinyl alcohol) or PVF (polyvinyl formal) is preferred due to easy production of the resin brush itself.

The cleaning temperature in the cleaning method of the semiconductor wafer of the present invention may be room temperature or may be heated to 30° C. to 70° C. as long as the performance of the semiconductor device is not impaired.

EXAMPLE

Hereinafter, the present invention will be described more specifically with reference to Examples. However, the present invention is not limited to the description of the following Examples as long as its gist is observed.

(Raw Material)

Surfactant (A-1): RA-600 (Trade name, manufactured by Toho Chemical Industry Co., Ltd., alkyl chain length of 6 to 10, ethylene oxide chain 4, phosphate ester surfactant)

Surfactant (A-2): EHD-400 (Trade name, manufactured by Nippon Nyukazai Co., Ltd., alkyl chain length of 8, ethylene oxide chain 2, phosphate ester surfactant)

Surfactant (A-3): Phosphanol ML-240 (Trade name, manufactured by Toho Chemical Industry Co., Ltd., alkyl chain length of 12, ethylene oxide chain 4, phosphate ester surfactant)

Surfactant (A-4): Phosphanol B-410 (Trade name, manufactured by Toho Chemical Industry Co., Ltd., alkyl chain length of 18 (unsaturated), ethylene oxide chain 4, phosphate ester surfactant)

Surfactant (A-5): AKYPO RLM-100 (Trade name, manufactured by Nikko Chemicals Co., Ltd., alkyl chain 12, ethylene oxide chain 10, carboxylic acid surfactant)

Surfactant (A'-1): Leocol TDA-407-75 (Trade name, manufactured by Lion Corporation, nonionic surfactant, alkyl chain 12, ethylene oxide chain 40)

Surfactant (A'-2): PEG6000 (Trade name, manufactured by Tokyo Chemical Industry Co., Ltd., polyethylene glycol, average molecular weight of 7300 to 9300)

Surfactant (A'-3): Benzotriazole (manufactured by Tokyo Chemical Industry Co., Ltd.) Surfactant (A'-4): Polyacrylic acid 5000 (Trade name, manufactured by Aldrich, polyacrylic acid, molecular weight of approximately 450,000)

Surfactant (A'-5): Dodecylbenzenesulfonic acid (Manufactured by Lion Corporation)

Oxidizing agent (B-1): 35 mass % hydrogen peroxide solution (Manufactured by Tokyo Chemical Industry Co., Ltd.)

pH adjusting agent (D-1): Tetraethylammonium hydroxide (Manufactured by Tokyo Chemical Industry Co., Ltd.)

pH adjusting agent (D-2): Propanolamine (Manufactured by Tokyo Chemical Industry Co., Ltd.)

Chelating agent (C1-1): L-serine (Manufactured by Tokyo Chemical Industry Co., Ltd.)

Chelating agent (C1-2): L-aspartic acid (Manufactured by Tokyo Chemical Industry Co., Ltd.)

Chelating agent (C1-3): Glycine (Manufactured by Tokyo Chemical Industry Co., Ltd.)

Chelating agent (C2-1): L-(+)-tartaric acid (Manufactured by Tokyo Chemical Industry Co., Ltd.)

Chelating agent (C2-2): Citric acid (Manufactured by Mitsubishi Chemical Corporation)

(pH Measurement)

A pH of the cleaning liquid obtained in each of Examples and Comparative Examples was measured with a pH meter (model name "D-24", manufactured by Horiba, Ltd.) while the cleaning liquid was stirred using a magnetic stirrer in a constant temperature bath at 25° C.

(Etching Rate Measurement)

A silicon substrate (20 mm×20 mm) on which a cobalt film was formed was immersed in the cleaning liquid obtained in each of Examples and Comparative Examples at 25° C. for 30 minutes. After the immersion, the silicon substrate was taken out, and a cobalt concentration in the cleaning liquid after immersion was measured by an ICP atomic emission spectrometer (model name "SPS 1700 HVR", manufactured by Seiko Instruments). From the measured cobalt concentration, a thickness of the cobalt film etched for 30 minutes was calculated, and an etching rate was obtained.

(Evaluation of Etching Rate)

An etching rate in each of Examples and Comparative Examples was evaluated by the following criteria.

A: An etching rate of less than 0.10 nm/min

B: An etching rate of 0.10 nm/min or more and less than 0.15 nm/min

C: An etching rate of 0.15 nm/min or more (Contact Angle Measurement)

A silicon substrate (10 mm×50 mm) on which a cobalt film was formed was immersed in 0.1 mass % citric acid (manufactured by Mitsubishi Chemical Corporation) for 1 minute, then, the silicon substrate was immersed in a 1 mass % aqueous solution of benzotriazole (manufactured by Tokyo Chemical Industry Co., Ltd.) for 10 seconds. Then, the silicon substrate was immersed in the cleaning liquid obtained in each of Examples and Comparative Examples for 2 minutes, rinsed with ultrapure water for 30 seconds, and dried with air blow. Approximately 3.0 µL of ultrapure water was dropped to the obtained silicon substrate, and the contact angle between the silicon substrate and the ultrapure water droplet was measured using a contact angle meter (model name "DM 700", manufactured by Kyowa Interface Science Co., Ltd.). The measurement was performed five times, and the average value of five measurements was defined as the contact angle.

(Evaluation of Contact Angle)

The contact angles of Examples and Comparative Examples were evaluated by the following criteria.

A: A contact angle of less than 40°

B: A contact angle of 40° or more and less than 48°

C: A contact angle of 48° or more

Example 1-1

In 100 mass % of the cleaning liquid, the components were mixed such that the surfactant (A-1) is 0.001 mass %, the chelating agent (C1-1) is 0.019 mass %, the chelating agent (C2-1) is 0.013 mass %, the pH adjusting agent (D-1) is 0.063 mass %, and the balance are water, and a cleaning liquid was obtained.

The evaluation results of the obtained cleaning liquid are shown in Table 1.

Examples 1-2 to 1-7 and Comparative Examples 1-1 to 1-19

A cleaning liquid was obtained in the same manner as in Example 1-1, except that the type and content of each component were as shown in Table 1.

The evaluation results of the obtained cleaning liquid are shown in Table 1.

TABLE 1

| | Surfactant (A) | | Chelating Agent (C) | | | | pH Adjusting Agent (D) | | | Etching rate | | Contact Angle | |
|---|---|---|---|---|---|---|---|---|---|---|---|---|---|
| | Type | Content (mass %) | Type | Content (mass %) | Type | Content (mass %) | Type | Content (mass %) | pH | (nm/min) | Evaluation | (°) | Evaluation |
| Example 1-1 | (A-1) | 0.001 | (C1-1) | 0.019 | (C2-1) | 0.013 | (D-1) | 0.063 | 11.0 | 0.06 | A | 32 | A |
| Example 1-2 | (A-1) | 0.001 | — | — | (C2-2) | 0.013 | (D-1) | 0.063 | 11.1 | 0.01 | A | 44 | B |
| Example 1-3 | (A-1) | 0.001 | (C1-3) | 0.019 | (C2-1) | 0.013 | (D-1) | 0.063 | 10.1 | 0.11 | B | 45 | B |
| Example 1-4 | (A-2) | 0.001 | (C1-1) | 0.019 | (C2-1) | 0.013 | (D-1) | 0.063 | 11.0 | 0.04 | A | 36 | A |

TABLE 1-continued

|  | Surfactant (A) | | Chelating Agent (C) | | | | pH Adjusting Agent (D) | | | Etching rate | | Contact Angle | |
| --- | --- | --- | --- | --- | --- | --- | --- | --- | --- | --- | --- | --- | --- |
|  | Type | Content (mass %) | Type | Content (mass %) | Type | Content (mass %) | Type | Content (mass %) | pH | (nm/min) | Evaluation | (°) | Evaluation |
| Example 1-5 | (A-3) | 0.001 | (C1-1) | 0.019 | (C2-1) | 0.013 | (D-1) | 0.063 | 10.9 | 0.04 | A | 43 | B |
| Example 1-6 | (A-4) | 0.001 | (C1-1) | 0.019 | (C2-1) | 0.013 | (D-1) | 0.063 | 10.9 | 0.04 | A | 44 | B |
| Example 1-7 | (A-5) | 0.001 | (C1-2) | 0.013 | (C2-1) | 0.006 | (D-1) | 0.063 | 11.3 | 0.13 | B | 43 | B |
| Comparative Example 1-1 | — | — | (C1-2) | 0.013 | (C2-1) | 0.001 | (D-1) | 0.063 | 10.7 | 0.21 | C | 34 | A |
| Comparative Example 1-2 | — | — | (C1-2) | 0.010 | (C2-1) | 0.010 | (D-1) | 0.060 | 11.2 | 0.18 | C | 39 | B |
| Comparative Example 1-3 | — | — | (C1-2) | 0.013 | (C2-1) | 0.001 | (D-2) | 0.113 | 10.7 | 0.21 | C | 31 | A |
| Comparative Example 1-4 | (A'-1) | 0.001 | (C1-2) | 0.013 | (C2-1) | 0.001 | (D-1) | 0.063 | 10.8 | 0.20 | C | 33 | A |
| Comparative Example 1-5 | (A'-1) | 0.001 | (C1-2) | 0.013 | (C2-1) | 0.001 | (D-2) | 0.113 | 10.8 | 0.20 | C | 40 | B |
| Comparative Example 1-6 | (A'-2) | 0.001 | (C1-2) | 0.013 | (C2-1) | 0.001 | (D-1) | 0.063 | 10.9 | 0.20 | C | 31 | A |
| Comparative Example 1-7 | (A'-2) | 0.001 | (C1-2) | 0.013 | (C2-1) | 0.001 | (D-2) | 0.113 | 10.9 | 0.20 | C | 40 | B |
| Comparative Example 1-8 | (A'-3) | 0.001 | (C1-2) | 0.013 | (C2-1) | 0.001 | (D-1) | 0.063 | 10.9 | 0.22 | C | 26 | A |
| Comparative Example 1-9 | (A'-3) | 0.001 | (C1-2) | 0.013 | (C2-1) | 0.001 | (D-2) | 0.113 | 10.9 | 0.22 | C | 40 | B |
| Comparative Example 1-10 | (A'-4) | 0.001 | (C1-2) | 0.013 | (C2-1) | 0.001 | (D-1) | 0.063 | 11.0 | 0.18 | C | 25 | A |
| Comparative Example 1-11 | (A'-4) | 0.001 | (C1-2) | 0.013 | (C2-1) | 0.001 | (D-2) | 0.113 | 11.0 | 0.18 | C | 36 | A |
| Comparative Example 1-12 | (A'-5) | 0.001 | (C1-1) | 0.013 | (C2-1) | 0.006 | (D-1) | 0.063 | 10.9 | 0.27 | C | 40 | B |
| Comparative Example 1-13 | (A'-5) | 0.001 | (C1-2) | 0.013 | (C2-1) | 0.006 | (D-1) | 0.063 | 10.9 | 0.33 | C | 33 | A |
| Comparative Example 1-14 | (A-1) | 0.001 | (C1-1) | 0.019 | (C2-1) | 0.013 | — | — | 3.4 | 0.18 | C | 25 | A |
| Comparative Example 1-15 | (A-1) | 0.001 | (C1-1) | 0.019 | (C2-1) | 0.013 | (D-1) | 0.025 | 5.1 | 0.27 | C | 50 | C |
| Comparative Example 1-16 | (A-2) | 0.001 | — | — | — | — | (D-1) | 0.063 | 11.4 | 0.00 | A | 50 | C |
| Comparative Example 1-17 | (A-3) | 0.001 | — | — | — | — | (D-1) | 0.063 | 11.4 | 0.00 | A | 52 | C |
| Comparative Example 1-18 | (A-4) | 0.001 | — | — | — | — | (D-1) | 0.063 | 11.4 | 0.00 | A | 53 | C |
| Comparative Example 1-19 | (A-4) | 0.006 | — | — | — | — | (D-2) | 0.113 | 11.1 | 0.00 | A | 62 | C |

As can be seen from Table 1, the cleaning liquids obtained in Examples 1-1 to 1-7 containing the surfactant (A) were excellent in anticorrosion properties to cobalt in comparison with the cleaning liquids which were obtained in Comparative Examples 1-1 to 1-3 and did not contain surfactants and the cleaning liquids which were obtained in Comparative Examples 1-4 to 1-13 and contained surfactants different from the surfactant (A). In addition, the cleaning liquids which were obtained in Examples 1-1 to 1-7 and had a pH of 8 or more were excellent in anticorrosion properties to cobalt, in comparison with the cleaning liquids which were obtained in Comparative Examples 1-14 to 1-15 and had a pH of being less than 8. Furthermore, the cleaning liquids which were obtained in Examples 1-1 to 1-7 and contained the chelating agent (C) was excellent in cleanability, in comparison with the cleaning liquids which were obtained in Comparative Examples 1-16 to 1-19 and did not contain the chelating agent (C).

Example 2-1

In 100 mass % of the cleaning liquid, the components were mixed such that the oxidizing agent (B-1) is 0.001 mass %, the chelating agent (C1-2) is 0.013 mass %, the chelating agent (C2-1) is 0.006 mass %, the pH adjusting agent (D-1) is 0.063 mass %, and the balance is water, and a cleaning liquid was obtained.

The evaluation results of the obtained cleaning liquids are shown in Table 2 and FIG. 1.

Examples 2-2 to 2-9 and Comparative Examples 2-1 to 2-4

A cleaning liquid was obtained in the same manner as in Example 2-1, except that the type and content of each component were as shown in Table 2.

The evaluation results of the obtained cleaning liquids are shown in Table 2 and FIG. 1.

TABLE 2

|  | Oxidizing Agent (B) | | Chelating Agent (C) | | | | pH Adjusting Agent (D) | | | Etching rate | | Contact Angle | |
|---|---|---|---|---|---|---|---|---|---|---|---|---|---|
|  | Type | Content (mass %) | Type | Content (mass %) | Type | Content (mass %) | Type | Content (mass %) | pH | (nm/min) | Evaluation | (°) | Evaluation |
| Example 2-1 | (B-1) | 0.001 | (C1-2) | 0.013 | (C2-1) | 0.006 | (D-1) | 0.063 | 11.2 | 0.02 | A | 34 | A |
| Example 2-2 | (B-1) | 0.001 | (C1-3) | 0.019 | (C2-2) | 0.013 | (D-1) | 0.063 | 10.3 | 0.10 | B | 31 | A |
| Example 2-3 | (B-1) | 0.001 | (C1-3) | 0.019 | — | — | (D-1) | 0.063 | 11.2 | 0.01 | A | 40 | B |
| Example 2-4 | (B-1) | 0.001 | — | — | (C2-2) | 0.013 | (D-1) | 0.063 | 11.3 | 0.00 | A | 40 | B |
| Example 2-5 | (B-1) | 0.001 | (C1-3) | 0.019 | (C2-1) | 0.013 | (D-1) | 0.063 | 10.5 | 0.04 | A | 40 | B |
| Example 2-6 | (B-1) | 0.013 | (C1-2) | 0.013 | (C2-1) | 0.006 | (D-1) | 0.063 | 10.9 | 0.03 | A | 31 | A |
| Example 2-7 | (B-1) | 0.100 | (C1-2) | 0.013 | (C2-1) | 0.006 | (D-1) | 0.063 | 10.3 | 0.05 | A | 40 | B |
| Example 2-8 | (B-1) | 0.500 | (C1-2) | 0.013 | (C2-1) | 0.006 | (D-1) | 0.063 | 9.6 | 0.09 | A | 46 | B |
| Example 2-9 | (B-1) | 1.000 | (C1-2) | 0.013 | (C2-1) | 0.006 | (D-1) | 0.063 | 9.3 | 0.11 | B | 41 | B |
| Comparative Example 2-1 | — | — | (C1-2) | 0.013 | (C2-1) | 0.006 | (D-1) | 0.063 | 11.2 | 0.18 | C | 26 | A |
| Comparative Example 2-2 | (B-1) | 0.001 | (C1-2) | 0.013 | (C2-1) | 0.006 | — | — | 3.5 | 0.30 | C | 24 | A |
| Comparative Example 2-3 | (B-1) | 0.001 | (C1-2) | 0.013 | (C2-1) | 0.006 | (D-1) | 0.025 | 5.7 | 0.41 | C | 22 | A |
| Comparative Example 2-4 | (B-1) | 0.001 | — | — | — | — | (D-1) | 0.063 | 11.8 | 0.00 | A | 49 | C |

As can be seen from Table 2, the cleaning liquids which were obtained in Examples 2-1 to 2-9 and contained the oxidizing agent (B) were excellent in anticorrosion properties to cobalt in comparison with the cleaning liquid which was obtained in Comparative Example 2-1 and did not contain the oxidizing agent (B). In addition, the cleaning liquids which were obtained in Examples 2-1 to 2-9 and had a pH of 8 or more were excellent in anticorrosion properties to cobalt, in comparison with the cleaning liquids which were obtained in Comparative Examples 2-2 to 2-3 and had a pH of being less than 8. Furthermore, the cleaning liquids which were obtained in Examples 2-1 to 2-9 and contained the chelating agent (C) were excellent in cleanability, in comparison with the cleaning liquid which was obtained in Comparative Example 2-4 and did not contain the chelating agent (C).

From the relationship of the etching rate to the pH in FIG. 1, the cleaning liquids which were obtained in Examples 2-1 to 2-9 and contained the oxidizing agent (B) were excellent in anticorrosion properties to cobalt in comparison with the cleaning liquid which was obtained in Comparative Example 2-1 and did not contain the oxidizing agent (B).

Although the present invention has been described in detail with reference to specific examples, it will be apparent to those skilled in the art that various changes and modifications can be made without departing from the spirit and scope of the present invention. This application is based on a Japanese patent application filed on Oct. 10, 2017 (Japanese Patent Application No. 2017-196812) and a Japanese patent application filed Oct. 23, 2017 (Japanese Patent Application No. 2017-204135), and the contents thereof are incorporated herein by reference.

INDUSTRIAL APPLICABILITY

Since the cleaning liquid of the present invention has a cleaning effect as a post-CMP cleaning liquid while suppressing corrosion of cobalt or a compound containing cobalt in the cleaning step of the semiconductor wafer after the CMP step, and therefore, the prevent invention is very industrially useful as a cleaning treatment technology of a semiconductor wafer in a production step of a semiconductor device, a display device, or the like.

The invention claimed is:

1. A cleaning liquid, comprising:
   a surfactant (A); and
   a chelating agent (C),
   wherein the cleaning liquid has a pH of 8 or more,
   wherein the surfactant (A) comprises at least one selected from the group consisting of a polyoxyalkylene alkyl ether phosphoric acid, a polyoxyalkylene alkyl ether acetic acid, and a polyoxyalkylene alkyl ether sulfonic acid, and
   wherein the cleaning liquid comprises no further water-soluble polymer beyond the surfactant (A) and, optionally, polyacrylic acid, polyethylene glycol, polypropylene glycol, a derivative thereof, or a mixture of two or more of any of these.

2. The cleaning liquid of claim 1, wherein the surfactant (A) comprises the polyoxyalkylene alkyl ether phosphoric acid.

3. A cleaning liquid, comprising:
   an oxidizing agent (B); and
   a chelating agent (C),
   wherein the cleaning liquid has a pH of 8 or more, and
   wherein the oxidizing agent (B) is present in a range of from 0.00001 to 0.8 mass %.

4. The cleaning liquid of claim 1, wherein the chelating agent (C) comprises an amino acid and/or polycarboxylic acid.

5. The cleaning liquid of claim 4, wherein the amino acid is at least one selected from the group consisting of serine and aspartic acid.

6. The cleaning liquid of claim 4, wherein the polycarboxylic acid comprises tartaric acid.

7. The cleaning liquid of claim 1, further comprising:
   a pH adjusting agent (D).

8. The cleaning liquid of claim 7, wherein a mass ratio of the chelating agent (C) to the pH adjusting agent (D) is in a range of from 1:1.5 to 1:8.

9. The cleaning liquid of claim 1, which is suitable for cleaning after chemical mechanical polishing or post-etch cleaning.

10. The cleaning liquid of claim 1, which is suitable for cleaning a surface where cobalt or a compound containing cobalt is exposed.

11. A cleaning method, comprising:
contacting a semiconductor wafer with the cleaning liquid of claim 1, thereby cleaning the semiconductor wafer.

12. A method for producing a semiconductor wafer, the method comprising:
cleaning a semiconductor wafer using the cleaning liquid of claim 1.

13. The cleaning liquid of claim 3, wherein the chelating agent (C) comprises at least one selected from the group consisting of amino acids and polycarboxylic acids.

14. The cleaning liquid of claim 3, further comprising:
a pH adjusting agent (D).

15. The cleaning liquid of claim 3, which is suitable for cleaning after chemical mechanical polishing or post-etch cleaning.

16. The cleaning liquid of claim 3, which is suitable for cleaning a surface where cobalt or a compound containing cobalt is exposed.

17. A cleaning method, comprising:
contacting a semiconductor wafer with the cleaning liquid of claim 3, thereby cleaning the semiconductor wafer.

18. A method for producing a semiconductor wafer, the method comprising:
cleaning a semiconductor wafer using the cleaning liquid of claim 3.

19. A cleaning method, comprising:
contacting a liquid cleaner with a surface comprising exposed cobalt and/or an exposed compound comprising cobalt,
wherein the cleaning liquid comprises a surfactant (A) and a chelating agent (C) and has a pH of 8 or more,
wherein the surfactant (A) comprises a polyoxyalkylene alkyl ether phosphoric acid, a polyoxyalkylene alkyl ether acetic acid, a polyoxyalkylene alkyl ether sulfonic acid, or a mixture or two or more of any of these.

20. The method of claim 19, wherein the cleaning liquid comprises no further water-soluble polymer beyond the surfactant (A) and, optionally, polyacrylic acid, polyethylene glycol, polypropylene glycol, a derivative thereof, or a mixture of two or more of any of these.

* * * * *